(12) United States Patent
Giannantonio et al.

(10) Patent No.: US 8,394,173 B2
(45) Date of Patent: Mar. 12, 2013

(54) METHOD FOR THE SORPTION OF GASEOUS CONTAMINANTS BY MEANS OF NANOSTRUCTURED SORBERS IN THE FORM OF A FIBER

(75) Inventors: Roberto Giannantonio, Oleggio (IT); Lorena Cattaneo, Busto Arsizio (IT)

(73) Assignee: Saes Getters S.p.A., Lainate (MI) (IT)

( * ) Notice: Subject to any disclaimer, the term of this patent is extended or adjusted under 35 U.S.C. 154(b) by 379 days.

(21) Appl. No.: 12/531,456

(22) PCT Filed: Apr. 1, 2008

(86) PCT No.: PCT/IB2008/000776
§ 371 (c)(1), (2), (4) Date: Sep. 15, 2009

(87) PCT Pub. No.: WO2008/120090
PCT Pub. Date: Oct. 9, 2008

(65) Prior Publication Data
US 2010/0031816 A1   Feb. 11, 2010

(30) Foreign Application Priority Data
Apr. 3, 2007 (IT) .............................. MI2007A0690

(51) Int. Cl.
*B01D 53/22* (2006.01)
(52) U.S. Cl. .................. 95/45; 96/4; 96/7; 96/8; 96/10
(58) Field of Classification Search ............ 95/45; 96/8, 96/10, 4, 7
See application file for complete search history.

(56) References Cited

U.S. PATENT DOCUMENTS

| | | | |
|---|---|---|---|
| 6,899,744 B2 * | 5/2005 | Mundschau | 95/56 |
| 7,376,315 B2 * | 5/2008 | Kurosawa et al. | 385/123 |
| 2004/0001893 A1 * | 1/2004 | Stupp et al. | 424/488 |
| 2004/0137225 A1 | 7/2004 | Balkus, Jr. et al. | |
| 2004/0159609 A1 * | 8/2004 | Chase | 210/636 |
| 2006/0083657 A1 * | 4/2006 | McDonnell et al. | 422/55 |
| 2008/0250816 A1 * | 10/2008 | Kurosawa et al. | 65/385 |
| 2010/0167078 A1 * | 7/2010 | Kim et al. | 428/546 |

FOREIGN PATENT DOCUMENTS

| | | |
|---|---|---|
| EP | 1385205 | 1/2004 |
| GB | 2426737 | 6/2006 |
| JP | 2005-264386 | 9/2005 |
| WO | 2004/072604 | 8/2004 |
| WO | 2005/005696 | 1/2005 |
| WO | 2005/0057704 | 1/2005 |
| WO | 2007/013118 | 2/2007 |

(Continued)

OTHER PUBLICATIONS

PCT Written Opinion for PCT/IB2008/000776 filed on Apr. 1, 2008 in the name of Roberto Giannantonio, et al.

(Continued)

*Primary Examiner* — Jason M Greene
*Assistant Examiner* — Anthony Shumate
(74) *Attorney, Agent, or Firm* — Steinfl & Bruno LLP

(57) ABSTRACT

There is described a method for the removal of gaseous contaminants from the housings of devices sensitive to the presence of such contaminants by means of nanostructured sorbers, wherein the sorber is in the form of a fiber containing an active material at its inside. Nanostructured sorbers and their manufacturing method are also described.

18 Claims, 1 Drawing Sheet

FOREIGN PATENT DOCUMENTS

| | | |
|---|---|---|
| WO | 2007/013119 | 2/2007 |
| WO | 2007/074494 | 7/2007 |

OTHER PUBLICATIONS

Lim S., et al., Correlation between dark spot growth and pinhole size in organic light-emitting diodes, Applied Physics Letters, Apr. 9, 2001, 78: 2116-2118.

PCT International Search Report for PCT/IB2008/000776 filed on Apr. 1, 2008 in the name of Saes Getters S.P.A.

PCT International Preliminary Report on Patentability (IPRP) for PCT/IB2008/000776 filed on Apr. 1, 2008 in the name of Saes Getters S.P.A.

Japanese Notice of Reason for Refusal issued on Aug. 21, 2012, for Japanese Application 2010-501608 filed on Apr. 3, 2007.

Japanese Notice of Reasons for Refusal issued on Jul. 26, 2011, for Japanese Application 2010-501608 filed on Apr. 3, 2007.

Chinese Office Action issued on Sep. 15, 2011 for Chinese Application 200880010076.5 filed on Apr. 3, 2007.

Kedem, S., et al., Composite Polymer Nanofibers with Carbon Nanotubes and Titanium Dioxide Particles, Langmuir 2005, 21:5600-5604.

\* cited by examiner

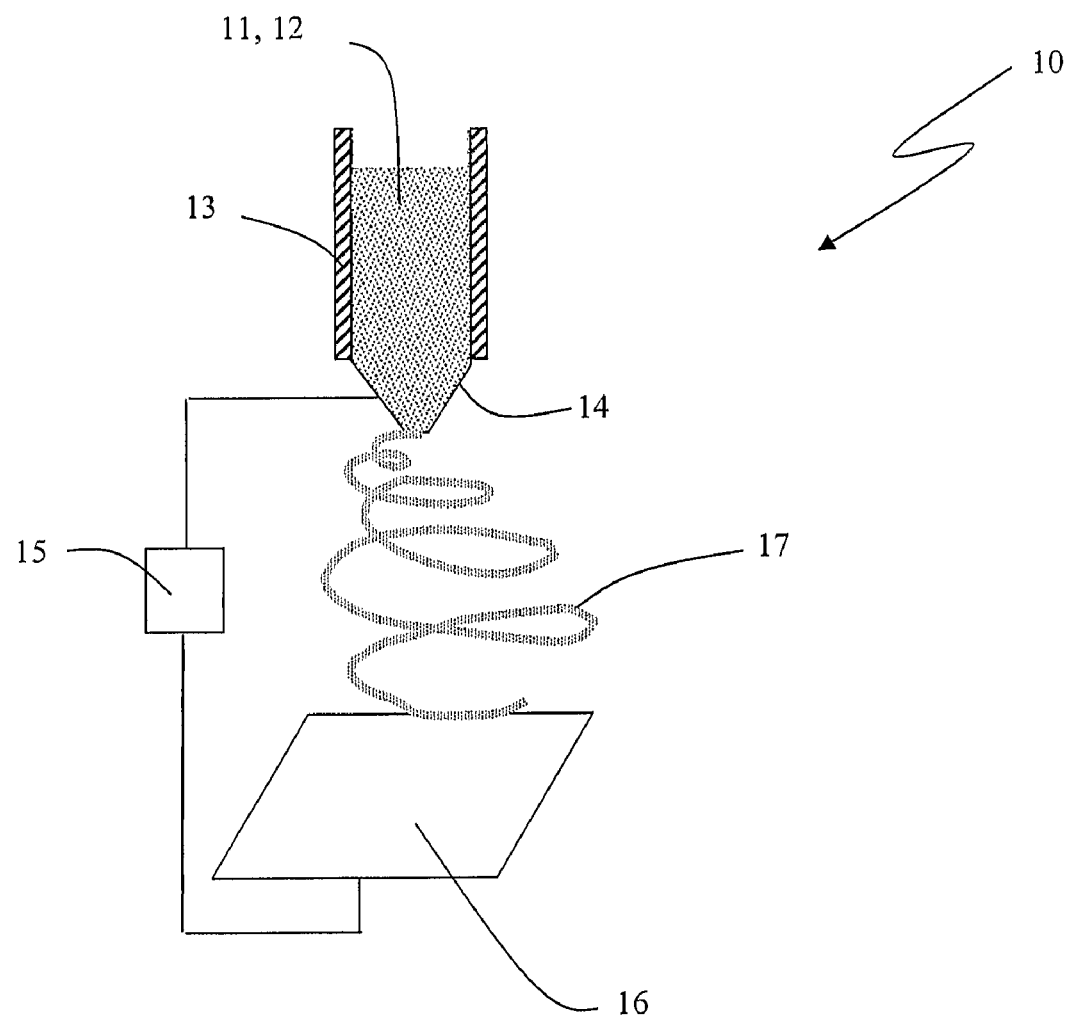

2

METHOD FOR THE SORPTION OF GASEOUS CONTAMINANTS BY MEANS OF NANOSTRUCTURED SORBERS IN THE FORM OF A FIBER

CROSS REFERENCE TO RELATED APPLICATIONS

The present application is the US national stage of International Application PCT/IB2008/000776 filed on Apr. 1, 2008 which, in turn, claims priority to Italian Application MI2007A000690, filed on Apr. 3, 2007.

BACKGROUND

Recent developments in the field of electronic devices, such as organic displays of the OLED type (Organic Light Emitting Display), and solar cells, such as OSC (Organic Solar Cells), have led to stricter requirements as to the removal of gaseous contaminants in the housings of these devices.

These devices are in fact very sensitive to the presence of gaseous contaminants, with particular reference to water and oxygen, which cause a progressive degradation of their performances. More information on the harmful effects of these contaminants may be found in article "Correlation between dark spot growth and pinhole size in organic light-emitting diodes" by Shuang Fang Lim et al., published in Applied Physics Letters, Vol. 78, Apr. 9, 2001, concerning OLED displays; and in the fifth chapter of the book "Organic Photovoltaics—Concepts and Realization" by Brabec et al., published in 2003 by Springer-Verlag, concerning solar cells of the OSC type.

The use of sorbers for the removal of gaseous impurities from the housings of devices sensitive to their presence is known. For instance, international patent application WO 2004/072604 in the applicant's name discloses the use of active components dispersed in suitable porous matrices, whereas international patent applications WO 2007/013118 and WO 2007/013119, both in the applicant's name, disclose nanostructured systems wherein the active component is restricted in a porous means, which is in turn dispersed in a polymeric matrix. The use of functionalized nucleuses dispersed in a permeable polymeric matrix is disclosed in international patent application WO 2007/074494.

SUMMARY

The present invention consists in a method for the sorption of gaseous contaminants that allows a more effective removal thereof, and in its first aspect, the invention consists in a method for the removal of gaseous contaminants from the housings of devices sensitive to their presence by means of nanostructured fibers containing dispersed nanopowders of an active material, wherein said fibers have a diameter not larger than 1000 nanometers (nm). In a preferred embodiment, the diameter of the nanostructured fibers is not larger than 100 nm.

The fibers of the invention might also have a cross-section that is not perfectly circular. In this case the term "diameter" is to be intended as the maximum thickness of the fiber.

BRIEF DESCRIPTION OF THE DRAWINGS

FIG. 1 shows the outline of a system for manufacturing nanostructured fibers by means of electrospinning.

DETAILED DESCRIPTION

The invention will be described in the following with reference to FIG. 1, which shows the outline of a system for manufacturing nanostructured fibers by means of electrospinning.

In FIG. 1 the size and the dimensional ratios of the various elements shown are not correct but have been altered in order to help understanding the drawing, with particular but not exclusive reference to the thickness of the nanostructured fiber.

The fiber may be made with polymeric materials, with particular reference to acetal polymers, acrylic polymers, cellulosic polymers, fluoropolymers, ionomers, polyamides, polycarbonate, polyesters, polyolefins, polysulfones, polyvinyl alcohol, vinyl polymers, styrenic polymers, polyurethanes, polyethylenglicole, polypropylenglycole, polyvinylpyrrolidone, polyvinylacetate, polysiloxanes, polyoxides, liquid crystal polymers, polyethers, polyanhydrides, polyimides, polyketones.

Useful active materials for the removal of $H_2O$ are the oxides of alkaline-earth metals, among which calcium oxide is preferred, zeolites and magnesium perchlorate.

The active material of the nanostructured fibers may comprise or be made of oxides of metals capable of increasing their oxidation state upon the interaction with oxygen, with particular reference to oxides of iron, nickel, copper and manganese in which manganese has an oxidation number from II to VI. These materials are suitable for the removal of $O_2$. Other sorbers of oxygen useful for carrying out the invention may be organic compounds with unsaturated bonds.

All the previous active materials are present in the fiber in form of dispersed nanopowders with a preferred size for the nanopowders not higher than half of the fiber thickness, i.e. the fiber radius.

The sorption of different gaseous species from the housing of the sensitive devices may be made through the use of composite fibers, wherein a plurality of sorber materials are provided inside the same fiber, or it is possible to use different nanostructured fibers inside the same housing, each having a specific active material and thus a specific reactivity towards a given contaminant. This type of solution has the advantage that it is possible to control the amount and the type of active material in view of the specific application, for example by increasing the amount of material able to sorb water by simply introducing a larger amount of the respective sorbing nanostructured fiber inside the housing of the sensitive device.

An interesting alternative embodiment of the nanostructured fibers useful for the removal of gaseous contaminants from the housings of sensitive devices provides for the use of nanotubes, i.e. hollow nanofibers. The advantage of this configuration is an increased activity toward moisture, or more generally speaking toward a contaminant, due to the exposed surface increase.

The removal of gaseous contaminants from the housings of the devices may occur in two ways:
  a) the sorber in the form of a disordered and packed fiber may be inserted into the housing, thus acting as a getter agent for the impurities,
  b) the sorber in the form of a fiber is enclosed between two layers of material, a first layer of material facing the outside of the housing and a second layer of material facing the sensitive device environment.

When these layer have a poor permeability, the enclosed sorber acts as an active barrier against the ingress of impurities. An analogous behavior is achieved when the fiber is dispersed in a single poorly permeable material.

An important variant of b) consists in enclosing the fiber between materials having different permeability to harmful gaseous species, in particular the first layer of material (facing the outside of the housing) must be poorly permeable or must be coupled with a poorly permeable material, in order to prevent gaseous impurities from entering into the housing of the device, whereas the second layer of material (facing the sensitive device), is porous and permeable to the harmful gaseous species. This type of solution is both an active barrier to the ingress of gaseous impurities, and a getter for the harmful gaseous species that may be present inside the housing for reasons other than the permeation of these species from the outer environment. A typical mechanism of internal generation of gaseous impurities is the "outgassing" of some components enclosed in the housing containing the device.

The expression poorly permeable material indicates a material having a permeability lower than or equal to $1 \times 10^{-12}$ $m^3(STP)\, m^{-3}\, bar^{-1}\, m^2\, s^{-1}$, where $m^3(STP)$ stands for cubic meters of gas measured at room temperature and a pressure of 100 kPa.

In a preferred embodiment the nanostructured fiber is enclosed between a poorly permeable material and a highly permeable material, the latter having a permeability of at least $1 \times 10^{-11}\, m^3(STP)\, m^{-3}\, bar^{-1}\, m^2\, s^{-1}$, wherein said highly permeable material acts as an interface between the nanostructured fiber and the inside of the housing of the sensitive device.

In a second aspect thereof, the invention relates to a method for manufacturing nanostructured fibers for the removal of contaminants.

A very interesting technique for manufacturing the previously-described nanostructured fibers is the electrospinning.

This technique is schematically represented in FIG. 1, which shows a system 10 for electrospinning comprising a syringe 13, whose end portion 14 is electrified by means of a suitable generator 15. This generator also establishes a potential difference with a surface 16 serving as an attractor and as a collecting plate for the fiber (17). The fiber is produced by starting from a precursor 11 in the liquid form, indicated in grey color, typically made of a polymer wherein other elements may be dispersed, such as, in the present case, the nanopowders of the active material having the purpose of sorbing the gaseous impurities, represented by a dotted element 12.

Usually, the content of the syringe is maintained in the liquid form also by heating the same through suitable means, not shown in the drawing.

The action of the electric field between the tip of the syringe and the collecting plate has the effect of stretching the fiber while being formed and of solidifying it once it has been dispensed from the syringe, thus allowing to obtain a nanostructured fiber with the active material nanopowders included inside it. More information concerning this manufacturing technique may be found in patent application US 2004/0137225, which discloses this manufacturing system related to systems for the controlled dispensing of medicines.

The use of two coaxial needles rather than a plate-needle geometry allows to obtain nanotubes.

In a third aspect thereof, the invention consists in a sorber for gaseous impurities made of one or more nanostructured fibers containing dispersed nanopowders of an active element, wherein said nanofiber has a diameter not larger than 1000 nm, and in a preferred embodiment such a diameter is not larger than 100 nm.

These nanostructured fibers may be present as such inside the housing of a sensitive device, or may be enclosed between a first layer of material facing the outside of the housing and a second layer of material facing the sensitive device environment, or the fiber may be dispersed inside a material. These materials confine the fiber and form a portion of the housing itself of the sensitive device.

At least one of these materials, the one used for the first layer, has a poor permeability to harmful gaseous species or is coupled with a poorly permeable material, whereas the material for the second layer may be either poorly permeable, thus creating an active barrier, or permeable to harmful gaseous species. In this case the fiber can also sorb the harmful gaseous species present inside the housing in addition to impede their ingress.

Active materials particularly suitable for the manufacturing of nanostructured fibers are alkaline-earth metal oxides, with particular reference to calcium oxide, and magnesium perchlorate.

The invention claimed is:

1. A method for removal of gaseous contaminants from a housing of a device sensitive to presence of the gaseous contaminants, the method comprising:
   providing nanostructured fibers containing dispersed nanopowders of an active material chosen among oxides of alkaline-earth metals, zeolites and magnesium perchlorate, said nanopowders of an active material being inside each of the nanostructured fibers, and wherein said nanostructured fibers have a diameter not larger than 1000 nm and are capable of removal of gaseous contaminants from the housing of the device.

2. The method according to claim 1, wherein said nanostructured fibers have a diameter not larger than 100 nm.

3. The method according to claim 1 wherein said nanopowders have dimensions equal to or less than a fiber radius.

4. The method according to claim 1, wherein said nanostructured fibers comprise a polymeric material.

5. The method according to claim 4, wherein said polymeric material is chosen among acetal polymers, acrylic polymers, cellulosic polymers, fluoropolymers, ionomers, polyamides, polycarbonate, polyesters, polyolefins, polysulfones, polyvinyl alcohol, vinyl polymers, styrenic polymers, polyurethanes, polyethylenglicole, polypropylenglycole, polyvinylpyrrolidone, polyvinylacetate, polysiloxanes, polyoxides, liquid crystal polymers, polyethers, polyanhydrides, polyimides, and polyketones.

6. The method according to claim 1, wherein said oxides of alkaline-earth metals comprise calcium oxide.

7. The method according to claim 1, wherein said nanostructured fibers contain a plurality of active materials.

8. The method according to claim 1, wherein the nanostructured fibers are a plurality of fibers including different active materials.

9. The method according to claim 1, wherein said nanostructured fibers are hollow nanostructured fibers.

10. The method according to claim 1, wherein said nanostructured fibers are dispersed in a poorly permeable material.

11. The method according to claim 1, wherein said nanostructured fibers are enclosed between a first layer of material facing an outside of the housing and a second layer of material facing a device environment sensitive to the presence of the gaseous contaminants.

12. The method according to claim 11, wherein said first layer of material has a poor permeability towards said gaseous contaminants.

13. The method according to claim 11, wherein said first layer of material and second layer of material have a poor permeability towards said gaseous contaminants.

14. The method according to claim 11, wherein said second layer of material has a high permeability to said gaseous contaminants.

15. The method according to claim 1 wherein the nanostructured fibers are manufactured by way of electrospinning.

16. The method according to claim 7, wherein said plurality of active materials are comprised of metal oxides capable of increasing their oxidation state by interacting with oxygen.

17. The method according to claim 6, wherein said metal oxides are chosen among iron, copper, nickel and maganese oxide.

18. The method according to claim 7, wherein said active material is an unsaturated organic compound.

* * * * *

UNITED STATES PATENT AND TRADEMARK OFFICE
CERTIFICATE OF CORRECTION

PATENT NO.       : 8,394,173 B2
APPLICATION NO.  : 12/531456
DATED            : March 12, 2013
INVENTOR(S)      : Giannantonio et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 471 days.

Signed and Sealed this
First Day of September, 2015

Michelle K. Lee
*Director of the United States Patent and Trademark Office*